US008821786B1

(12) United States Patent
Biberger (10) Patent No.: US 8,821,786 B1
(45) Date of Patent: Sep. 2, 2014

(54) METHOD OF FORMING OXIDE DISPERSION STRENGTHENED ALLOYS

(75) Inventor: Maximilian A. Biberger, Scottsdale, AZ (US)

(73) Assignee: SDCmaterials, Inc., Tempe, AZ (US)

( * ) Notice: Subject to any disclaimer, the term of this patent is extended or adjusted under 35 U.S.C. 154(b) by 690 days.

(21) Appl. No.: 12/969,087

(22) Filed: Dec. 15, 2010

Related U.S. Application Data

(60) Provisional application No. 61/284,329, filed on Dec. 15, 2009.

(51) Int. Cl.
*B22F 3/12* (2006.01)
*B22F 1/02* (2006.01)

(52) U.S. Cl.
USPC ............ 419/19; 419/23; 419/30; 419/32; 419/39; 427/216; 977/776

(58) Field of Classification Search
USPC .............. 419/19, 20, 23, 30, 32, 33, 35
See application file for complete search history.

(56) References Cited

U.S. PATENT DOCUMENTS

| | | | |
|---|---|---|---|
| 2,284,554 A | 5/1942 | Beyerstedt | 196/10 |
| 2,419,042 A | 4/1947 | Todd | 202/205 |
| 2,519,531 A | 8/1950 | Worn | 230/95 |
| 2,562,753 A | 7/1951 | Trost | 241/39 |
| 2,689,780 A | 9/1954 | Rice | 23/106 |
| 3,001,402 A | 9/1961 | Koblin | 73/421.5 |
| 3,042,511 A | 7/1962 | Reding, Jr. | |
| 3,067,025 A | 12/1962 | Chisholm | 75/84.5 |
| 3,145,287 A | 8/1964 | Siebein et al. | |
| 3,178,121 A | 4/1965 | Wallace, Jr | 241/5 |
| 3,179,782 A | 4/1965 | Matvay | |
| 3,181,947 A * | 5/1965 | Vordahl | 419/19 |
| 3,313,908 A | 4/1967 | Unger et al. | |
| 3,401,465 A | 9/1968 | Larwill | 34/57 |
| 3,450,926 A | 6/1969 | Kieman | 313/231 |
| 3,457,788 A | 7/1969 | Miyajima | 73/422 |
| 3,537,513 A | 11/1970 | Austin | 165/70 |
| 3,552,653 A | 1/1971 | Inoue | |
| 3,617,358 A | 11/1971 | Dittrich | |
| 3,667,111 A | 6/1972 | Chartet | |
| 3,741,001 A | 6/1973 | Fletcher et al. | 73/28 |
| 3,752,172 A | 8/1973 | Cohen et al. | 137/12 |
| 3,761,360 A | 9/1973 | Auvil et al. | |
| 3,774,442 A | 11/1973 | Gustavsson | 73/28 |
| 3,804,034 A | 4/1974 | Stiglich, Jr. | |
| 3,830,756 A | 8/1974 | Sanchez et al. | 252/462 |
| 3,871,448 A | 3/1975 | Vann et al. | |
| 3,892,882 A | 7/1975 | Guest et al. | 427/34 |
| 3,914,573 A | 10/1975 | Muehlberger | 219/76 |
| 3,959,094 A | 5/1976 | Steinberg | |
| 3,959,420 A | 5/1976 | Geddes et al. | 261/112 |
| 3,969,482 A | 7/1976 | Teller | |
| 4,008,620 A | 2/1977 | Narato et al. | 73/421.5 A |
| 4,018,388 A | 4/1977 | Andrews | 241/39 |
| 4,021,021 A | 5/1977 | Hall et al. | |
| 4,127,760 A | 11/1978 | Meyer et al. | |
| 4,139,497 A | 2/1979 | Castor et al. | 252/470 |
| 4,157,316 A | 6/1979 | Thompson et al. | 252/462 |
| 4,171,288 A | 10/1979 | Keith et al. | 252/462 |
| 4,174,298 A | 11/1979 | Antos | 252/441 |
| 4,189,925 A | 2/1980 | Long | |
| 4,227,928 A | 10/1980 | Wang | |
| 4,248,387 A | 2/1981 | Andrews | 241/5 |
| 4,253,917 A | 3/1981 | Wang | |
| 4,260,649 A | 4/1981 | Dension et al. | |
| 4,284,609 A | 8/1981 | deVries | 423/242 |
| 4,315,874 A | 2/1982 | Ushida et al. | |
| 4,344,779 A | 8/1982 | Isserlis | |
| 4,369,167 A | 1/1983 | Weir | |
| 4,388,274 A | 6/1983 | Rourke et al. | 422/177 |
| 4,419,331 A | 12/1983 | Montalvo | |
| 4,431,750 A | 2/1984 | McGinnis et al. | 502/329 |
| 4,436,075 A | 3/1984 | Campbell et al. | 123/557 |
| 4,440,733 A | 4/1984 | Lawson et al. | |

(Continued)

FOREIGN PATENT DOCUMENTS

EP  1 134 302 A1  9/2001
EP  1 619 168 A1  1/2006

(Continued)

OTHER PUBLICATIONS

Bateman, James E. et al. "Alkylation of Porous Silicon by Direct Reaction with Alkenes and Alkynes," Angew. Chem Int. Ed., Dec. 17, 1998, 37, No. 19, pp. 2683-2685.

(Continued)

*Primary Examiner* — George Wyszomierski
*Assistant Examiner* — Ngoclan T Mai
(74) *Attorney, Agent, or Firm* — Morrison & Foerster LLP (57) ABSTRACT

A method of forming an oxide-dispersion strengthened alloy and a method for forming an oxide-alloy powder where the oxide-nanoparticles are evenly distributed throughout the powder. The method is comprised of the steps of forming an oxide-nanoparticles colloid, mixing the oxide-nanoparticles colloid with alloy-microparticles forming an oxide-alloy colloid, drying the oxide-alloy colloid solution to form an oxide-alloy powder, applying pressure to the oxide-alloy powder, and heating the oxide-alloy powder to a sintering temperature. The oxide-nanoparticles are sized to be between 1-10 nanometers in diameter. The ratio of oxide-nanoparticles to alloy-microparticles should be 1-5% by weight. Heating of the oxide-alloy powder can use a spark plasma sintering process.

14 Claims, 4 Drawing Sheets

(56) References Cited

U.S. PATENT DOCUMENTS

| | | | |
|---|---|---|---|
| 4,458,138 A | 7/1984 | Adrian et al. | |
| 4,459,327 A | 7/1984 | Wang | |
| 4,505,945 A | 3/1985 | Dubust et al. | |
| 4,513,149 A | 4/1985 | Gray et al. | 564/449 |
| 4,523,981 A | 6/1985 | Ang et al. | |
| 4,545,872 A | 10/1985 | Sammells et al. | |
| RE32,244 E | 9/1986 | Andersen | |
| 4,609,441 A | 9/1986 | Frese, Jr. et al. | |
| 4,723,589 A | 2/1988 | Iyer et al. | |
| 4,731,517 A | 3/1988 | Cheney | |
| 4,764,283 A | 8/1988 | Ashbrook et al. | 210/695 |
| 4,765,805 A | 8/1988 | Wahl et al. | |
| 4,824,624 A | 4/1989 | Palicka et al. | 264/67 |
| 4,836,084 A | 6/1989 | Vogelesang et al. | |
| 4,855,505 A | 8/1989 | Koll | 564/398 |
| 4,866,240 A | 9/1989 | Webber | 219/121.47 |
| 4,885,038 A | 12/1989 | Anderson et al. | |
| 4,921,586 A | 5/1990 | Molter | |
| 4,983,555 A | 1/1991 | Roy et al. | 501/120 |
| 4,987,033 A | 1/1991 | Abkowitz et al. | 428/469 |
| 5,006,163 A * | 4/1991 | Benn et al. | 75/229 |
| 5,015,863 A | 5/1991 | Takeshima et al. | |
| 5,041,713 A | 8/1991 | Weidman | 219/121.51 |
| 5,043,548 A | 8/1991 | Whitney et al. | 219/121.84 |
| 5,070,064 A | 12/1991 | Hsu et al. | |
| 5,073,193 A | 12/1991 | Chaklader et al. | 75/346 |
| 5,133,190 A | 7/1992 | Abdelmalek | |
| 5,151,296 A | 9/1992 | Tokunaga | |
| 5,157,007 A | 10/1992 | Domesle et al. | 502/66 |
| 5,192,130 A | 3/1993 | Endo et al. | |
| 5,230,844 A | 7/1993 | Macaire et al. | |
| 5,233,153 A | 8/1993 | Coats | |
| 5,269,848 A | 12/1993 | Nakagawa | |
| 5,338,716 A | 8/1994 | Triplett et al. | |
| 5,369,241 A | 11/1994 | Taylor et al. | 219/121.47 |
| 5,371,049 A | 12/1994 | Moffett et al. | 501/89 |
| 5,372,629 A | 12/1994 | Anderson et al. | 75/332 |
| 5,392,797 A | 2/1995 | Welch | 134/108 |
| 5,436,080 A | 7/1995 | Inoue et al. | |
| 5,439,865 A | 8/1995 | Abe et al. | 502/333 |
| 5,442,153 A | 8/1995 | Marantz et al. | 219/121.47 |
| 5,460,701 A | 10/1995 | Parker et al. | |
| 5,464,458 A | 11/1995 | Yamamoto | |
| 5,485,941 A | 1/1996 | Guyomard et al. | 222/1 |
| 5,534,149 A | 7/1996 | Birkenbeil et al. | 210/636 |
| 5,534,270 A | 7/1996 | De Castro | |
| 5,543,173 A | 8/1996 | Horn, Jr. et al. | |
| 5,553,507 A | 9/1996 | Basch et al. | 73/863.01 |
| 5,562,966 A | 10/1996 | Clarke et al. | |
| 5,582,807 A | 12/1996 | Liao et al. | |
| 5,611,896 A | 3/1997 | Swanepoel et al. | 204/169 |
| 5,630,322 A | 5/1997 | Heilmann et al. | 62/95 |
| 5,652,304 A | 7/1997 | Calderon et al. | |
| 5,714,644 A | 2/1998 | Irgang et al. | |
| 5,723,187 A | 3/1998 | Popoola et al. | |
| 5,726,414 A | 3/1998 | Kitahashi et al. | |
| 5,749,938 A | 5/1998 | Coombs | 75/332 |
| 5,776,359 A | 7/1998 | Schultz et al. | 252/62.51 |
| 5,788,738 A | 8/1998 | Pirzada et al. | 75/331 |
| 5,811,187 A | 9/1998 | Anderson et al. | 428/403 |
| 5,837,959 A | 11/1998 | Muehlberger et al. | 219/121.47 |
| 5,851,507 A | 12/1998 | Pirzada et al. | 423/659 |
| 5,853,815 A | 12/1998 | Muehlberger | 427/446 |
| 5,858,470 A | 1/1999 | Bernecki et al. | |
| 5,905,000 A | 5/1999 | Yadav et al. | 429/33 |
| 5,928,806 A | 7/1999 | Olah et al. | |
| 5,935,293 A | 8/1999 | Detering et al. | 75/10.29 |
| 5,973,289 A | 10/1999 | Read et al. | |
| 5,989,648 A | 11/1999 | Phillips | 427/456 |
| 5,993,967 A | 11/1999 | Brotzman, Jr. et al. | 428/407 |
| 5,993,988 A | 11/1999 | Ohara et al. | 429/40 |
| 6,004,620 A | 12/1999 | Camm | |
| 6,012,647 A | 1/2000 | Ruta et al. | 239/132.1 |
| 6,033,781 A | 3/2000 | Brotzman, Jr. et al. | 428/405 |
| 6,045,765 A | 4/2000 | Nakatsuji et al. | |
| 6,059,853 A | 5/2000 | Coombs | 75/332 |
| 6,084,197 A | 7/2000 | Fusaro, Jr. | |
| 6,093,306 A | 7/2000 | Hanrahan et al. | |
| 6,102,106 A | 8/2000 | Manning et al. | 165/76 |
| 6,117,376 A | 9/2000 | Merkel | |
| 6,168,694 B1 | 1/2001 | Huang et al. | |
| 6,213,049 B1 | 4/2001 | Yang | 118/723 |
| 6,214,195 B1 | 4/2001 | Yadav et al. | 205/334 |
| 6,228,904 B1 | 5/2001 | Yadav et al. | 523/210 |
| 6,254,940 B1 | 7/2001 | Pratsinis et al. | 427/562 |
| 6,261,484 B1 | 7/2001 | Phillips et al. | 264/5 |
| 6,267,864 B1 | 7/2001 | Yadav et al. | 205/341 |
| 6,322,756 B1 | 11/2001 | Arno et al. | |
| 6,342,465 B1 | 1/2002 | Klein et al. | 502/339 |
| 6,344,271 B1 | 2/2002 | Yadav et al. | 428/402 |
| 6,362,449 B1 | 3/2002 | Hadidi et al. | |
| 6,379,419 B1 | 4/2002 | Celik et al. | 75/346 |
| 6,387,560 B1 | 5/2002 | Yadav et al. | 429/45 |
| 6,395,214 B1 | 5/2002 | Kear et al. | 264/434 |
| 6,398,843 B1 | 6/2002 | Tarrant | 75/249 |
| 6,409,851 B1 | 6/2002 | Sethuram et al. | 148/565 |
| 6,413,781 B1 | 7/2002 | Geis et al. | 436/178 |
| 6,416,818 B1 | 7/2002 | Aikens et al. | 427/383.1 |
| RE37,853 E | 9/2002 | Detering et al. | 75/10.19 |
| 6,444,009 B1 | 9/2002 | Liu et al. | 75/332 |
| 6,475,951 B1 | 11/2002 | Domesle et al. | |
| 6,506,995 B1 | 1/2003 | Fusaro, Jr. et al. | |
| 6,517,800 B1 | 2/2003 | Cheng et al. | 423/447.1 |
| 6,524,662 B2 | 2/2003 | Jang et al. | 427/535 |
| 6,531,704 B2 | 3/2003 | Yadav et al. | 250/493.1 |
| 6,548,445 B1 | 4/2003 | Buysch et al. | 502/230 |
| 6,554,609 B2 | 4/2003 | Yadav et al. | 432/9 |
| 6,562,304 B1 | 5/2003 | Mizrahi | |
| 6,562,495 B2 | 5/2003 | Yadav et al. | 429/12 |
| 6,569,397 B1 | 5/2003 | Yadav et al. | 423/345 |
| 6,569,518 B2 | 5/2003 | Yadav et al. | 428/323 |
| 6,572,672 B2 | 6/2003 | Yadav et al. | 75/343 |
| 6,579,446 B1 | 6/2003 | Teran et al. | |
| 6,596,187 B2 | 7/2003 | Coll et al. | 216/56 |
| 6,603,038 B1 | 8/2003 | Hagemeyer et al. | 560/241.1 |
| 6,607,821 B2 | 8/2003 | Yadav et al. | 428/323 |
| 6,610,355 B2 | 8/2003 | Yadav et al. | 427/115 |
| 6,623,559 B2 | 9/2003 | Huang | 117/87 |
| 6,635,357 B2 | 10/2003 | Moxson et al. | 428/548 |
| 6,641,775 B2 | 11/2003 | Vigliotti et al. | 264/618 |
| 6,652,822 B2 | 11/2003 | Phillips et al. | 423/290 |
| 6,652,967 B2 | 11/2003 | Yadav et al. | 428/403 |
| 6,669,823 B1 | 12/2003 | Sarkas et al. | 204/164 |
| 6,682,002 B2 | 1/2004 | Kyotani | 239/318 |
| 6,689,192 B1 | 2/2004 | Phillips et al. | 75/342 |
| 6,699,398 B1 | 3/2004 | Kim | 216/55 |
| 6,706,097 B2 | 3/2004 | Zornes | 96/153 |
| 6,706,660 B2 | 3/2004 | Park | |
| 6,710,207 B2 | 3/2004 | Bogan, Jr. et al. | 562/549 |
| 6,713,176 B2 | 3/2004 | Yadav et al. | 428/402 |
| 6,716,525 B1 | 4/2004 | Yadav et al. | 428/402 |
| 6,744,006 B2 | 6/2004 | Johnson et al. | |
| 6,746,791 B2 | 6/2004 | Yadav et al. | 429/30 |
| 6,772,584 B2 | 8/2004 | Chun et al. | 60/275 |
| 6,786,950 B2 | 9/2004 | Yadav et al. | 75/346 |
| 6,813,931 B2 | 11/2004 | Yadav et al. | 73/31.05 |
| 6,817,388 B2 | 11/2004 | Tsangaris et al. | 141/82 |
| 6,832,735 B2 | 12/2004 | Yadav et al. | 241/16 |
| 6,838,072 B1 | 1/2005 | Kong et al. | 423/594.2 |
| 6,841,509 B1 | 1/2005 | Hwang et al. | |
| 6,855,410 B2 | 2/2005 | Buckley | |
| 6,855,426 B2 * | 2/2005 | Yadav | 428/403 |
| 6,855,749 B1 | 2/2005 | Yadav et al. | 523/105 |
| 6,858,170 B2 | 2/2005 | Van Thillo et al. | |
| 6,886,545 B1 | 5/2005 | Holm | 123/568.21 |
| 6,896,958 B1 | 5/2005 | Cayton et al. | 428/323 |
| 6,902,699 B2 | 6/2005 | Fritzemeier et al. | 419/38 |
| 6,916,872 B2 | 7/2005 | Yadav et al. | 524/430 |
| 6,919,065 B2 | 7/2005 | Zhou et al. | |
| 6,919,527 B2 | 7/2005 | Boulos et al. | 219/121.52 |
| 6,933,331 B2 | 8/2005 | Yadav et al. | 523/210 |
| 6,972,115 B1 | 12/2005 | Ballard | |
| 6,986,877 B2 | 1/2006 | Takikawa et al. | 423/447.3 |
| 6,994,837 B2 | 2/2006 | Boulos et al. | 423/613 |

(56) References Cited

U.S. PATENT DOCUMENTS

| | | | |
|---|---|---|---|
| 7,007,872 B2 | 3/2006 | Yadav et al. ........................ 241/1 |
| 7,022,305 B2 | 4/2006 | Drumm et al. |
| 7,052,777 B2 | 5/2006 | Brotzman, Jr. et al. ....... 428/570 |
| 7,073,559 B2 | 7/2006 | O'Larey et al. .............. 164/76.1 |
| 7,081,267 B2 | 7/2006 | Yadav ............................ 427/115 |
| 7,101,819 B2 | 9/2006 | Rosenflanz et al. ............. 501/10 |
| 7,147,544 B2 | 12/2006 | Rosenflanz ...................... 451/28 |
| 7,147,894 B2 | 12/2006 | Zhou et al. ..................... 427/256 |
| 7,166,198 B2 | 1/2007 | Van Der Walt et al. ........ 204/165 |
| 7,166,663 B2 | 1/2007 | Cayton et al. .................. 524/430 |
| 7,172,649 B2 | 2/2007 | Conrad et al. ................... 106/35 |
| 7,172,790 B2 | 2/2007 | Koulik et al. .................. 427/212 |
| 7,178,747 B2 | 2/2007 | Yadav et al. ....................... 241/23 |
| 7,208,126 B2 | 4/2007 | Musick et al. ................... 423/69 |
| 7,211,236 B2 | 5/2007 | Stark et al. .................. 423/592.1 |
| 7,217,407 B2 | 5/2007 | Zhang ........................... 423/610 |
| 7,220,398 B2 | 5/2007 | Sutorik et al. ............... 423/593.1 |
| 7,255,498 B2 | 8/2007 | Bush et al. |
| 7,265,076 B2 | 9/2007 | Taguchi et al. |
| 7,307,195 B2 | 12/2007 | Polverejan et al. ............ 585/443 |
| 7,323,655 B2 | 1/2008 | Kim .......................... 219/121.43 |
| 7,384,447 B2 | 6/2008 | Kodas et al. ..................... 75/332 |
| 7,402,899 B1 | 7/2008 | Whiting et al. |
| 7,417,008 B2 | 8/2008 | Richards et al. ............... 502/306 |
| 7,494,527 B2 | 2/2009 | Jurewicz et al. ............. 423/245.1 |
| 7,517,826 B2 | 4/2009 | Fujdala et al. |
| 7,534,738 B2 | 5/2009 | Fujdala et al. |
| 7,541,012 B2 | 6/2009 | Yeung et al. ................. 423/245.1 |
| 7,541,310 B2 | 6/2009 | Espinoza et al. |
| 7,557,324 B2 | 7/2009 | Nylen et al. |
| 7,572,315 B2 | 8/2009 | Boulos et al. ..................... 75/336 |
| 7,576,029 B2 | 8/2009 | Saito et al. |
| 7,604,843 B1 | 10/2009 | Robinson et al. |
| 7,611,686 B2 | 11/2009 | Alekseeva et al. ............. 423/276 |
| 7,615,097 B2 | 11/2009 | McKechnie et al. ............. 75/346 |
| 7,618,919 B2 | 11/2009 | Shimazu et al. |
| 7,622,693 B2 | 11/2009 | Foret ........................ 219/121.43 |
| 7,632,775 B2 | 12/2009 | Zhou et al. |
| 7,635,218 B1 | 12/2009 | Lott |
| 7,674,744 B2 | 3/2010 | Shiratori et al. |
| 7,678,419 B2 | 3/2010 | Kevwitch et al. |
| 7,704,369 B2 | 4/2010 | Olah et al. |
| 7,709,411 B2 | 5/2010 | Zhou et al. |
| 7,709,414 B2 | 5/2010 | Fujdala et al. |
| 7,745,367 B2 | 6/2010 | Fujdala et al. |
| 7,750,265 B2 | 7/2010 | Belashchenko |
| 7,803,210 B2 | 9/2010 | Sekine et al. .................... 75/334 |
| 7,851,405 B2 | 12/2010 | Wakamatsu et al. |
| 7,874,239 B2 | 1/2011 | Howland |
| 7,897,127 B2 | 3/2011 | Layman et al. |
| 7,902,104 B2 | 3/2011 | Kalck |
| 7,905,942 B1 | 3/2011 | Layman |
| 7,935,655 B2 | 5/2011 | Tolmachev |
| 8,051,724 B1 | 11/2011 | Layman et al. |
| 8,076,258 B1 | 12/2011 | Biberger |
| 8,080,494 B2 | 12/2011 | Yasuda et al. |
| 8,089,495 B2 | 1/2012 | Keller |
| 8,142,619 B2 | 3/2012 | Layman et al. |
| 8,168,561 B2 | 5/2012 | Virkar |
| 8,173,572 B2 | 5/2012 | Feaviour |
| 8,258,070 B2 | 9/2012 | Fujdala et al. |
| 8,278,240 B2 | 10/2012 | Tange et al. |
| 8,294,060 B2 | 10/2012 | Mohanty et al. |
| 8,309,489 B2 | 11/2012 | Cuenya et al. |
| 8,349,761 B2 | 1/2013 | Xia et al. |
| 2001/0004009 A1 | 6/2001 | MacKelvie |
| 2001/0042802 A1 | 11/2001 | Youds ............................... 241/5 |
| 2002/0018815 A1 | 2/2002 | Sievers et al. ................. 424/489 |
| 2002/0068026 A1 | 6/2002 | Murrell et al. ................. 422/211 |
| 2002/0079620 A1 | 6/2002 | DuBuis et al. ............. 264/328.14 |
| 2002/0100751 A1 | 8/2002 | Carr |
| 2002/0102674 A1 | 8/2002 | Anderson ...................... 435/174 |
| 2002/0131914 A1 | 9/2002 | Sung |
| 2002/0143417 A1 | 10/2002 | Ito et al. ........................... 700/95 |
| 2002/0182735 A1 | 12/2002 | Kibby et al. ..................... 436/37 |
| 2002/0183191 A1 | 12/2002 | Faber et al. |
| 2002/0192129 A1 | 12/2002 | Shamouilian et al. |
| 2003/0036786 A1 | 2/2003 | Duren et al. ..................... 607/96 |
| 2003/0042232 A1 | 3/2003 | Shimazu .................. 219/121.47 |
| 2003/0047617 A1 | 3/2003 | Shanmugham et al. |
| 2003/0066800 A1 | 4/2003 | Saim et al. ........................ 264/5 |
| 2003/0108459 A1 | 6/2003 | Wu et al. .................... 422/186.04 |
| 2003/0110931 A1 | 6/2003 | Aghajanian et al. |
| 2003/0139288 A1 | 7/2003 | Cai et al. ........................ 502/303 |
| 2003/0143153 A1 | 7/2003 | Boulos et al. |
| 2003/0172772 A1 | 9/2003 | Sethuram et al. ................ 501/87 |
| 2003/0223546 A1 | 12/2003 | McGregor et al. ............. 378/143 |
| 2004/0009118 A1 | 1/2004 | Phillips et al. ............... 423/592.1 |
| 2004/0023302 A1 | 2/2004 | Archibald et al. .............. 435/7.1 |
| 2004/0023453 A1 | 2/2004 | Xu et al. ........................ 257/369 |
| 2004/0077494 A1 | 4/2004 | LaBarge et al. ................ 502/303 |
| 2004/0103751 A1 | 6/2004 | Joseph et al. ................. 75/10.19 |
| 2004/0109523 A1 | 6/2004 | Singh et al. |
| 2004/0119064 A1 | 6/2004 | Narayan et al. |
| 2004/0127586 A1 | 7/2004 | Jin et al. ........................ 518/715 |
| 2004/0167009 A1 | 8/2004 | Kuntz et al. ................. 501/95.2 |
| 2004/0176246 A1 | 9/2004 | Shirk et al. .................... 502/439 |
| 2004/0208805 A1 | 10/2004 | Fincke et al. |
| 2004/0213998 A1 | 10/2004 | Hearley et al. ................ 428/402 |
| 2004/0238345 A1 | 12/2004 | Koulik et al. |
| 2004/0251017 A1 | 12/2004 | Pillion et al. .................. 165/289 |
| 2004/0251241 A1 | 12/2004 | Blutke et al. |
| 2005/0000321 A1 | 1/2005 | O'Larey et al. ................. 75/952 |
| 2005/0000950 A1 | 1/2005 | Schroder et al. ......... 219/121.59 |
| 2005/0066805 A1 | 3/2005 | Park et al. |
| 2005/0070431 A1 | 3/2005 | Alvin et al. |
| 2005/0077034 A1 | 4/2005 | King ............................. 165/163 |
| 2005/0097988 A1 | 5/2005 | Kodas et al. .................... 75/332 |
| 2005/0106865 A1 | 5/2005 | Chung et al. |
| 2005/0133121 A1* | 6/2005 | Subramanian et al. ........ 148/325 |
| 2005/0163673 A1 | 7/2005 | Johnson et al. |
| 2005/0199739 A1 | 9/2005 | Kuroda et al. ................... 239/13 |
| 2005/0220695 A1 | 10/2005 | Abatzoglou et al. .......... 423/445 |
| 2005/0227864 A1 | 10/2005 | Sutorik et al. |
| 2005/0233380 A1 | 10/2005 | Pesiri et al. ..................... 435/7.1 |
| 2005/0240069 A1 | 10/2005 | Polverejan et al. ............ 585/444 |
| 2005/0258766 A1 | 11/2005 | Kim ......................... 315/111.21 |
| 2005/0275143 A1 | 12/2005 | Toth |
| 2006/0051505 A1 | 3/2006 | Kortshagen et al. ........... 427/212 |
| 2006/0068989 A1 | 3/2006 | Ninomiya et al. ............. 502/339 |
| 2006/0094595 A1 | 5/2006 | Labarge ........................ 502/325 |
| 2006/0096393 A1 | 5/2006 | Pesiri ......................... 73/863.21 |
| 2006/0105910 A1 | 5/2006 | Zhou et al. .................... 502/338 |
| 2006/0108332 A1 | 5/2006 | Belashchenko .......... 219/121.47 |
| 2006/0153728 A1* | 7/2006 | Schoenung et al. ............. 419/32 |
| 2006/0153765 A1 | 7/2006 | Pham-Huu et al. ............ 423/345 |
| 2006/0159596 A1 | 7/2006 | De La Veaux et al. ........ 422/151 |
| 2006/0166809 A1 | 7/2006 | Malek et al. |
| 2006/0213326 A1 | 9/2006 | Gollob et al. |
| 2006/0222780 A1 | 10/2006 | Gurevich et al. |
| 2006/0231525 A1 | 10/2006 | Asakawa et al. ................ 216/56 |
| 2007/0048206 A1 | 3/2007 | Hung et al. .................... 423/335 |
| 2007/0049484 A1 | 3/2007 | Kear et al. |
| 2007/0063364 A1 | 3/2007 | Hsiao et al. ....................... 264/5 |
| 2007/0084308 A1 | 4/2007 | Nakamura et al. .............. 75/346 |
| 2007/0084834 A1 | 4/2007 | Hanus et al. .................. 219/121.5 |
| 2007/0087934 A1 | 4/2007 | R.M. Martens et al. ....... 502/214 |
| 2007/0163385 A1 | 7/2007 | Takahashi et al. |
| 2007/0173403 A1 | 7/2007 | Koike et al. ................... 502/300 |
| 2007/0178673 A1 | 8/2007 | Gole et al. |
| 2007/0221404 A1 | 9/2007 | Das et al. |
| 2007/0253874 A1 | 11/2007 | Foret ........................ 422/186.07 |
| 2007/0292321 A1 | 12/2007 | Plischke et al. ............... 422/198 |
| 2008/0006954 A1 | 1/2008 | Yubuta et al. |
| 2008/0026041 A1 | 1/2008 | Tepper et al. |
| 2008/0031806 A1 | 2/2008 | Gavenonis et al. ............ 423/608 |
| 2008/0038578 A1 | 2/2008 | Li |
| 2008/0047261 A1 | 2/2008 | Han et al. |
| 2008/0057212 A1 | 3/2008 | Dorier et al. |
| 2008/0064769 A1 | 3/2008 | Sato et al. |
| 2008/0105083 A1 | 5/2008 | Nakamura et al. .............. 75/255 |
| 2008/0116178 A1 | 5/2008 | Weidman ................... 219/121.47 |
| 2008/0125308 A1 | 5/2008 | Fujdala et al. |
| 2008/0125313 A1 | 5/2008 | Fujdala et al. |

(56) References Cited

U.S. PATENT DOCUMENTS

| | | | |
|---|---|---|---|
| 2008/0138651 A1 | 6/2008 | Doi et al. | |
| 2008/0175936 A1 | 7/2008 | Tokita et al. | |
| 2008/0187714 A1 | 8/2008 | Wakamatsu et al. | |
| 2008/0206562 A1 | 8/2008 | Stucky et al. | |
| 2008/0207858 A1 | 8/2008 | Kowaleski et al. | 526/176 |
| 2008/0248704 A1 | 10/2008 | Mathis et al. | |
| 2008/0274344 A1 | 11/2008 | Vieth et al. | 428/304.4 |
| 2008/0277092 A1 | 11/2008 | Layman et al. | 165/281 |
| 2008/0277266 A1 | 11/2008 | Layman et al. | 204/157.15 |
| 2008/0277267 A1 | 11/2008 | Biberger et al. | |
| 2008/0277268 A1 | 11/2008 | Layman | 204/164 |
| 2008/0277269 A1 | 11/2008 | Layman et al. | 423/215.5 |
| 2008/0277270 A1 | 11/2008 | Biberger | 204/164 |
| 2008/0277271 A1 | 11/2008 | Layman et al. | 422/130 |
| 2008/0280049 A1 | 11/2008 | Kevwitch et al. | 427/243 |
| 2008/0280751 A1 | 11/2008 | Harutyunyan et al. | |
| 2008/0280756 A1 | 11/2008 | Biberger | 502/232 |
| 2008/0283411 A1 | 11/2008 | Eastman et al. | |
| 2008/0283498 A1 | 11/2008 | Yamazaki | |
| 2009/0010801 A1 | 1/2009 | Murphy et al. | 422/4 |
| 2009/0054230 A1 | 2/2009 | Veeraraghavan et al. | |
| 2009/0088585 A1 | 4/2009 | Schammel et al. | 562/409 |
| 2009/0092887 A1 | 4/2009 | McGrath et al. | |
| 2009/0098402 A1 | 4/2009 | Kang et al. | |
| 2009/0114568 A1 | 5/2009 | Trevino et al. | 208/139 |
| 2009/0162991 A1 | 6/2009 | Beneyton et al. | |
| 2009/0168506 A1 | 7/2009 | Han et al. | |
| 2009/0170242 A1 | 7/2009 | Lin et al. | |
| 2009/0181474 A1 | 7/2009 | Nagai | |
| 2009/0200180 A1 | 8/2009 | Capote et al. | |
| 2009/0208367 A1 | 8/2009 | Calio et al. | |
| 2009/0223410 A1 | 9/2009 | Jun et al. | |
| 2009/0253037 A1 | 10/2009 | Park et al. | |
| 2009/0274903 A1 | 11/2009 | Addiego | 428/337 |
| 2009/0286899 A1 | 11/2009 | Hofmann et al. | 522/99 |
| 2010/0089002 A1 | 4/2010 | Merkel | |
| 2010/0124514 A1* | 5/2010 | Chelluri et al. | 419/13 |
| 2010/0275781 A1 | 11/2010 | Tsangaris | |
| 2011/0006463 A1 | 1/2011 | Layman | |
| 2011/0052467 A1 | 3/2011 | Chase et al. | |
| 2011/0143041 A1 | 6/2011 | Layman et al. | |
| 2011/0143915 A1 | 6/2011 | Yin et al. | |
| 2011/0143916 A1 | 6/2011 | Leamon | |
| 2011/0143926 A1 | 6/2011 | Yin et al. | |
| 2011/0143930 A1 | 6/2011 | Yin et al. | |
| 2011/0143933 A1 | 6/2011 | Yin et al. | |
| 2011/0144382 A1 | 6/2011 | Yin et al. | |
| 2011/0152550 A1 | 6/2011 | Grey et al. | |
| 2011/0158871 A1 | 6/2011 | Arnold et al. | |
| 2011/0174604 A1 | 7/2011 | Duesel et al. | |
| 2011/0243808 A1 | 10/2011 | Fossey et al. | |
| 2011/0245073 A1 | 10/2011 | Oljaca et al. | |
| 2011/0247336 A9 | 10/2011 | Farsad et al. | |
| 2012/0045373 A1 | 2/2012 | Biberger | |
| 2012/0097033 A1 | 4/2012 | Arnold et al. | |
| 2012/0122660 A1 | 5/2012 | Andersen et al. | |
| 2012/0171098 A1 | 7/2012 | Hung et al. | |
| 2012/0308467 A1 | 12/2012 | Carpenter et al. | |
| 2013/0213018 A1 | 8/2013 | Yin et al. | |

FOREIGN PATENT DOCUMENTS

| | | | |
|---|---|---|---|
| GB | 1 307 941 A | 2/1973 | |
| JP | 56-146804 | 11/1981 | B22F 9/08 |
| JP | 61-086815 A | 5/1986 | |
| JP | 63-214342 A | 9/1988 | |
| JP | 1-164795 A | 6/1989 | |
| JP | 05-228361 A | 9/1993 | |
| JP | 05-324094 A | 12/1993 | |
| JP | 6-93309 A | 4/1994 | |
| JP | 6-135797 A | 5/1994 | |
| JP | 6-272012 A | 9/1994 | |
| JP | H6-065772 U | 9/1994 | |
| JP | 7031873 A | 2/1995 | B01J 19/08 |
| JP | 07-256116 A | 10/1995 | |
| JP | 11-502760 A | 3/1999 | |
| JP | 2000-220978 A | 8/2000 | |
| JP | 2002-336688 A | 11/2002 | |
| JP | 2004-233007 A | 8/2004 | |
| JP | 2004-249206 A | 9/2004 | |
| JP | 2004-290730 A | 10/2004 | |
| JP | 2005-503250 A | 2/2005 | |
| JP | 2005-122621 A | 5/2005 | |
| JP | 2005-218937 A | 8/2005 | |
| JP | 2005-342615 A | 12/2005 | |
| JP | 2006-001779 A | 1/2006 | |
| JP | 2006-508885 A | 3/2006 | |
| JP | 2006-247446 A | 9/2006 | |
| JP | 2006-260385 A | 9/2006 | |
| JP | 2007-46162 A | 2/2007 | |
| JP | 2007-203129 A | 8/2007 | |
| SU | 493241 | 1/1976 | B01J 11/22 |
| TW | 200611449 | 4/2006 | |
| TW | 201023207 | 6/2010 | |
| WO | WO-96/28577 A1 | 9/1996 | |
| WO | WO 02/92503 | 11/2002 | C01B 21/064 |
| WO | WO 2004/052778 A2 | 6/2004 | C01B 13/28 |
| WO | WO-2005/063390 A1 | 7/2005 | |
| WO | WO 2006/079213 A1 | 8/2006 | B01J 2/04 |
| WO | WO-2008/13045 A3 | 10/2008 | |
| WO | WO-2008/130451 A2 | 10/2008 | |
| WO | WO-2011/081833 A1 | 7/2011 | |

OTHER PUBLICATIONS

Langner, Alexander et al., "Controlled Silicon Surface Functionalization by Alkene Hydrosilylation," J. Am. Chem. Soc., Aug. 25, 2005, 127, pp. 12798-12799.

Liu, Shu-Man et al., "Enhanced Photoluminescence from Si Nano-organosols by Functionalization with Alkenes and Their Size Evolution," Chem. Mater., Jan. 13, 2006, 18, pp. 637-642.

Fojtik, Anton, "Surface Chemistry of Luminescent Colloidal Silicon Nanoparticles," J. Phys. Chem. B., Jan. 13, 2006, pp. 1994-1998.

Li, Dejin et al., "Environmentally Responsive "Hairy" Nanoparticles: Mixed Homopolymer Brushes on Silica Nanoparticles Synthesized by Living Radical Polymerization Techniques," J.Am. Chem. Soc., Apr. 9, 2005, 127, pp. 6248-6256.

Neiner, Doinita, "Low-Temperature Solution Route to Macroscopic Amounts of Hydrogen Terminated Silicon Nanoparticles," J. Am. Chem. Soc., Aug. 5, 2006, 128, pp. 11016-11017.

Fojtik, Anton et al., "Luminescent Colloidal Silicon Particles," Chemical Physics Letters 221, Apr. 29, 1994, pp. 363-367.

Netzer, Lucy et al., "A New Approach to Construction of Artificial Monolayer Assemblies," J. Am. Chem. Soc., 1983, 105, pp. 674-676.

Chen, H.-S. Et al., "On the Photoluminescence of Si Nanoparticles," Mater. Phys. Mech. 4, Jul. 3, 2001, pp. 62-66.

Kwon, Young-Soon et al. "Passivation Process for Superfine Aluminum Powders Obtained by Electrical Explosion of Wires," Applied Surface Science 211, Apr. 30, 2003, pp. 57-67.

Liao, Ying-Chih et al., "Self-Assembly of Organic Monolayers on Aerosolized Silicon Nanoparticles," J.Am. Chem. Soc., Jun. 27, 2006, 128, pp. 9061-9065.

Zou, Jing et al., "Solution Synthesis of Ultrastable Luminescent Siloxane-Coated Silicon Nanoparticles," Nano Letters, Jun. 4, 2004, vol. 4, No. 7, pp. 1181-1186.

Tao, Yu-Tai, "Structural Comparison of Self-Assembled Monolayers of n-Alkanoic Acids on the surfaces of Silver, Copper, and Aluminum," J. Am. Chem. Soc., May 1993, 115, pp. 4350-4358.

Sailor, Michael et al., "Surface Chemistry of Luminescent Silicon Nanocrystallites," Adv. Mater, 1997, 9, No. 10, pp. 783-793.

Li, Xuegeng et al., "Surface Functionalization of Silicon Nanoparticles Produced by Laser-Driven Pyrolysis of Silane Followed by HF-HNO3 Etching," Langmuir, May 25, 2004, pp. 4720-4727.

Carrot, Geraldine et al., "Surface-Initiated Ring-Opening Polymerization: A Versatile Method for Nanoparticle Ordering," Macromolecules, Sep. 17, 2002, 35, pp. 8400-8404.

Jouet, R. Jason et al., "Surface Passivation of Bare Aluminum Nanoparticles Using Perfluoroalkyl Carboxylic Acids," Chem. Mater., Jan. 25, 2005, 17, pp. 2987-2996.

(56) References Cited

OTHER PUBLICATIONS

Yoshida, Toyonobu, "The Future of Thermal Plasma Processing for Coating," Pure & Appl. Chem., vol. 66, No. 6, 1994, pp. 1223-1230.

Kim, Namyong Y. et al., "Thermal Derivatization of Porous Silicon with Alcohols," J. Am. Chem. Soc., Mar. 5, 1997, 119, pp. 2297-2298.

Hua, Fengiun et al., "Organically Capped Silicon Nanoparticles with Blue Photoluminescence Prepared by Hydrosilylation Followed by Oxidation" Langmuir, Mar. 2006, pp. 4363-4370.

A. Gutsch et al., "Gas-Phase Production of Nanoparticles", Kona No. 20, 2002, pp. 24-37.

Dr. Heike Mühlenweg et al., "Gas-Phase Reactions—Open Up New Roads to Nanoproducts", Degussa ScienceNewsletter No. 08, 2004, pp. 12-16.

Coating Generation: Vaporization of Particles in Plasma Spraying and Splat Formation, M. Vardelle, A. Vardelle ,K-1 li P. Fauchais, Universite de Limoges, 123 Avenue A. Thomas 87000, Limoges, F. , Pure & Chem, vol. 68, No. 5, pp. 1093-1099, 1996.

H. Konrad et al., "Nanostructured Cu-Bi Alloys Prepared by Co-Evaporation in a Continuous Gas Flow," NanoStructured Materials, vol. 7, No. 6, 1996, pp. 605-610.

Kenvin et al. "Supported Catalysts Prepared from Mononuclear Copper Complexes: Catalytic Properties", Journal of Catalysis, pp. 81-91, (1992).

J. Heberlein, "New Approaches in Thermal Plasma Technology", Pure Appl. Chem., vol. 74, No. 3, 2002, pp. 327-335.

M. Vardelle et al., "Experimental Investigation of Powder Vaporization in Thermal Plasma Jets," Plasma Chemistry and Plasma Processing, vol. 11, No. 2, Jun. 1991, pp. 185-201.

National Aeronautics and Space Administration, "Enthalpy", http://www.grc.nasa.gov/WWW/K-12/airplane/enthalpy.html, Nov. 23, 2009, 1 page.

P. Fauchais et al.,"Plasma Spray: Study of the Coating Generation," Ceramics International, Elsevier, Amsterdam, NL, vol. 22, No. 4, Jan. 1996, pp. 295-303.

P. Fauchais et al., "Les Dépôts Par Plasma Thermique," Revue Generale De L'Electricitie, RGE. Paris, FR, No. 2, Jan. 1993, pp. 7-12.

P. Fauchais et al, "La Projection Par Plasma: Une Revue," Annales De Physique, vol. 14, No. 3, Jun. 1989, pp. 261-310.

T. Yoshida, "The Future of Thermal Plasma Processing for Coating", Pure & Appl. Chem., vol. 66, No. 6, 1994 pp. 1223-1230.

Han et al., Deformation Mechanisms and Ductility of Nanostructured Al Alloys, Mat. Res. Soc. Symp. Proc. vol. 821, Jan. 2004, Material Research Society, http://www.mrs.org/s_mrs/bin.asp?CID=2670&DOC=FILE.PDF., 6 pages.

Nagai, Yasutaka, et al. "Sintering Inhibition Mechanism of Platinum Supported on Ceria-based Oxide and Pt-oxide-support Interaction," Journal of Catalysis 242 (2006), pp. 103-109, Jul. 3, 2006, Elsevier.

Derwent English Abstract for publication No. SU 193241 A, Application No. 1973SU1943286 filed on Jul. 2, 1973 published on Mar. 1, 1976, entitled "Catalyst for Ammonia Synthesis Contains Oxides of Aluminum, Potassium, Calcium, Iron and Nickel Oxide for Increased Activity," 3 pgs.

Babin, A. et al. (1985). "Solvents Used in the Arts," Center for Safety in the Arts: 16 pages.

Chen, W.-J. et al. (Mar. 18, 2008). "Functional $Fe_3O_4/TiO_2$ Core/Shell Magnetic Nanoparticles as Photokilling Agents for Pathogenic Bacteria," Small 4(4): 485-491.

Faber, K. T. et al. (Sep. 1988). "Toughening by Stress-Induced Microcracking in Two-Phase Ceramics," Journal of the American Ceramic Society 71: C-399-C401.

Gangeri, M. et al. (2009). "Fe and Pt Carbon Nanotubes for the Electrocatalytic Conversion of Carbon Dioxide to Oxygenates," Catalysis Today 143: 57-63.

Ji, Y. et al. (Nov. 2002) "Processing and Mechanical Properties of $Al_2O_3$—5 vol.% Cr Nanocomposites," Journal of the European Ceramic Society 22(12):1927-1936.

Luo, J. et al. (2008). "Core/Shell Nanoparticles as Electrocatalysts for Fuel Cell Reactions," Advanced Materials 20: 4342-4347.

Mignard, D. et al. (2003). "Methanol Synthesis from Flue-Gas $CO_2$ and Renewable Electricity: A Feasibility Study," International Journal of Hydrogen Energy 28: 455-464.

Park, H.-Y. et al. (May 30, 2007). "Fabrication of Magnetic Core@Shell Fe Oxide@Au Nanoparticles for Interfacial Bioactivity and Bio-Separation," Langmuir 23: 9050-9056.

Park, N.-G. et al. (Feb. 17, 2004). "Morphological and Photoelectrochemical Characterization of Core-Shell Nanoparticle Films for Dye-Sensitized Solar Cells: Zn—O Type Shell on $SnO_2$ and $TiO_2$ Cores," Langmuir 20: 4246-4253.

"Plasma Spray and Wire Flame Spray Product Group," located at http://www.processmaterials.com/spray.html, published by Process Materials, Inc., last accessed Aug. 5, 2013, 2 pages.

"Platinum Group Metals: Annual Review 1996" (Oct. 1997). Engineering and Mining Journal, p. 63.

Rahaman, R. A. et al. (1995). "Synthesis of Powders," in Ceramic Processing and Sintering. Marcel Decker, Inc., New York, pp. 71-77.

Stiles, A. B. (Jan. 1, 1987). "Manufacture of Carbon-Supported Metal Catalysts," in Catalyst Supports and Supported Catalysts, Butterworth Publishers, MA, pp. 125-132.

Subramanian, S. et al. (1991). "Structure and Activity of Composite Oxide Supported Platinum-Iridium Catalysts," Applied Catalysts 74: 65-81.

Ünal, N. et al. (Nov. 2011). "Influence of WC Particles on the Microstructural and Mechanical Properties of 3 mol% $Y_2O_3$ Stabilized $ZrO_2$ Matrix Composites Produced by Hot Pressing," Journal of the European Ceramic Society (31)13: 2267-2275.

U.S. Appl. No. 13/291,983, filed Nov. 8, 2011, for Layman et al.
U.S. Appl. No. 12/152,084, filed May 9, 2008, for Biberger.
U.S. Appl. No. 13/028,693, filed Feb. 16, 2011, for Biberger.
U.S. Appl. No. 12/943,909, filed Nov. 10, 2010, for Layman.
U.S. Appl. No. 12/152,111, filed May 9, 2008, for Biberger et al.
U.S. Appl. No. 12/151,830, filed May 8, 2008, for Biberger et al.
U.S. Appl. No. 12/968,248, filed Dec. 14, 2010, for Biberger.
U.S. Appl. No. 12/968,245, filed Dec. 14, 2010, for Biberger.
U.S. Appl. No. 12/968,241, filed Dec. 14, 2010, for Biberger.
U.S. Appl. No. 12/968,239, filed Dec. 14, 2010, for Biberger.
U.S. Appl. No. 12/969,128, filed Dec. 15, 2010, for Biberger.
U.S. Appl. No. 12/962,463, filed Dec. 7, 2010, for Leaman.
U.S. Appl. No. 12/961,030, filed Dec. 6, 2010, for Lehman.
U.S. Appl. No. 12/961,108, filed Dec. 6, 2010, for Lehman.
U.S. Appl. No. 12/961,200, filed Dec. 6, 2010, for Lehman.
U.S. Appl. No. 12/968,253, filed Dec. 14, 2010, for Biberger.
U.S. Appl. No. 12/968,235, filed Dec. 14, 2010, for Biberger.
U.S. Appl. No. 12/969,306, filed Dec. 15, 2010, for Lehman et al.
U.S. Appl. No. 12/969,447, filed Dec. 15, 2010, for Biberger et al.
U.S. Appl. No. 12/962,533, filed Dec. 7, 2010, for Yin et al.
U.S. Appl. No. 12/962,523, filed Dec. 7, 2010, for Yin et al.
U.S. Appl. No. 12/001,643, filed Dec. 11, 2007, for Biberger et al.
U.S. Appl. No. 12/474,081, filed May 28, 2009, for Biberger et al.
U.S. Appl. No. 12/001,602, filed Dec. 11, 2007, for Biberger et al.
U.S. Appl. No. 12/001,644, filed Dec. 11, 2007, for Biberger et al.
U.S. Appl. No. 12/969,457, filed Nov. 15, 2010, for Leamon et al.
U.S. Appl. No. 12/969,503, filed Nov. 15, 2010, for Leamon et al.
U.S. Appl. No. 12/954,813, filed Nov. 26, 2010, for Biberger.
U.S. Appl. No. 12/954,822, filed Nov. 26, 2010, for Biberger.
U.S. Appl. No. 13/033,514, filed Feb. 23, 2011, for Biberger et al.
U.S. Appl. No. 13/589,024, filed Aug. 17, 2012, for Yin et al.
U.S. Appl. No. 13/801,726, filed Mar. 13, 2013, for Qi et al.

* cited by examiner

METHOD OF FORMING OXIDE DISPERSION STRENGTHENED ALLOYS

CROSS-REFERENCE TO RELATED APPLICATIONS

This application claims priority to U.S. Provisional Patent Application Ser. No. 61/284,329, filed Dec. 15, 2009 and entitled "MATERIALS PROCESSING," which is hereby incorporated herein by reference in its entirety as if set forth herein.

FIELD OF THE INVENTION

The present invention is related to a method of forming materials with oxide dispersions. More specifically, the present invention relates to a method of forming alloys with oxide dispersions for material strengthening.

BACKGROUND OF THE INVENTION

One physical attribute that provides flexibility in metals is the presence of dislocations within the lattice structure of the metal thus allowing the metal to flex and bend. A bending force causes the dislocation to propagate through the metal. Such a characteristic has several drawbacks. First, the ability of the dislocation to propagate through the metal reduces the ability of the metal to resist bending and shear forces. Further, the ability of a metal to bend becomes more pronounced at higher temperatures. Secondly, repetitive or excessive bending can cause the dislocations to aggregate and cause metal embrittlement. It is known in the field of material science that if an oxide material is added to a metal alloy where the oxide particles have the proper size, quantity, and a substantially uniform dispersion, then these oxide particles can interrupt the propagation of a dislocation through the metal lattice. As a result, the metal is strengthened and will better resist bending forces at high temperatures. This attribute is especially important in applications such as the hot end of a jet turbine. The turbine discs are exposed to the hot exhaust gasses that are weakened by the high operating temperatures. It is preferable to operate turbines at the highest possible temperature to achieve the highest possible operating efficiencies. Thus, any method to produce a stronger turbine disc, which provides for a higher operating temperature, is highly desirable.

For years, people skilled in the relevant art have known of the advantages of oxide dispersion strengthened alloys. However, it is also known that the current state-of-the-art has not developed technology to form an alloy with evenly dispersed oxide particles of a nanometer size required to interrupt the dislocation propagation. Mixing the oxide-nanoparticles into a molten alloy has failed to result in an even dispersion of oxide particles of the proper size and thus has failed to achieve the sought after theoretical strength increases. This is because oxide particles are immiscible with a molten alloy but will clump when added. What is needed is a method of forming an oxide dispersion strengthened alloy with nano-sized oxide particles where the oxide particles are evenly distributed throughout the alloy lattice structure.

SUMMARY OF THE INVENTION

In a first aspect of the invention, a method of forming an oxide-dispersion strengthened alloy is disclosed. In a first step, a quantity of oxide-nanoparticles is mixed in with a liquid to form a colloidal suspension that has the oxide-nanoparticles evenly suspended in the liquid. Preferably, substantially all of the oxide-nanoparticles are suspended and do not clump into larger oxide-nanoparticle groups.

In a next step, the oxide-nanoparticle colloid solution is mixed with a second quantity of alloy-microparticles. This mixture forms an oxide-alloy colloid. The oxide-nanoparticles adhere to the alloy-microparticles. Preferably, most of the oxide-nanoparticles adhere to the alloy-microparticles and not to other oxide-nanoparticles.

In a further step, the oxide-alloy colloid mixture is dried. Drying can occur through any common drying techniques, such as evaporation, vacuum techniques, freezing, centrifugal, and chemical drying. Once the liquid is removed from the oxide-alloy colloid, remaining is an oxide-alloy powder with a substantially uniform distribution of oxide nanoparticles on alloy-microparticles. In another step, the oxide-alloy powder is heated to a temperature that results in sintering of the alloy particles. A number of heating techniques are contemplated, including applying outside heat to the oxide-alloy powder or generating an internal heat by passing an electrical current through the powder.

In one embodiment of the present invention, the oxide-nanoparticles are between 1 and 10 nanometers in diameter. Preferably, the particles are 5 nanometers or smaller in diameter. In another embodiment, the oxide-nanoparticles comprise 1-5% by weight of the resulting oxide-alloy powder. In yet another embodiment, the alloy-microparticles contain nickel. Further, the alloy-microparticles can contain greater than 50% nickel. In another embodiment of the present invention, the oxide-nanoparticles are formed from either alumina ($Al_2O_3$), silica ($SiO_2$), or Yttria ($Y_2O_3$), or any combination thereof. In a further embodiment of the invention, the oxide-alloy powder is subjected to an axial pressure before or during heating or both before and during heating. The pressure is preferably asserted by an axial die, but other techniques are contemplated, including a graphite die. In yet another embodiment of the invention, the oxide-alloy powder is heated by a SPS (spark plasma sintering) process where DC current is pulsed through the oxide-alloy powder. This electric current causes the pressed oxide-alloy powder to heat rapidly, internally, and substantially evenly. The oxide-alloy is heated until it reaches a sintering temperature. In one embodiment of the invention, the SPS process uses a graphite die to apply pressure to the oxide-alloy powder.

In another embodiment of the present invention, before heating and applying pressure to the oxide-alloy powder, the powder is ball-milled. Ball-milling produces a powder that has an enhanced distribution of oxide-nanoparticles within the alloy powder and forms nano-oxide regions within the alloy-microparticles.

In a second aspect of the invention, a method of forming an oxide-alloy powder is disclosed, wherein the oxide particles are nanoparticle sized and are substantially evenly distributed throughout the powder. In a first step, a quantity of oxide-nanoparticles is mixed with a liquid to form a colloidal solution wherein the oxide-nanoparticles are evenly suspended in the solution. Preferably, substantially all of the oxide-nanoparticles are individually suspended in the solution and do not clump into larger oxide-nanoparticle groups.

In a second step, the oxide-nanoparticle colloid solution is mixed with a second quantity of alloy-microparticles. This mixture forms a new oxide-alloy colloid. The oxide-nanoparticles adhere to the alloy-microparticles. Preferably, most of the oxide-nanoparticles adhere to the alloy-microparticles and not to the other oxide-nanoparticles.

In a third step, the oxide-alloy colloid mixture is dried. Drying can occur through any common drying techniques, such as evaporation, vacuum techniques, and chemical drying. Once the liquid is removed from the oxide-alloy colloid, remaining is an oxide-alloy powder. In one embodiment of the present invention, the oxide-nanoparticles are between 1 and 10 nanometers in diameter. Preferably, the oxide-nanoparticles are 5 nanometers or smaller in diameter. In another embodiment, the oxide-nanoparticles comprise 1-5% by weight of the resulting oxide-alloy powder. In another embodiment of the present invention, before heating and applying pressure to the oxide-alloy powder, the powder is ball-milled, which produces an enhanced distribution of oxide-nanoparticles within the alloy.

BRIEF DESCRIPTION OF THE DRAWINGS

The present invention is better understood by reading the following detailed description of an exemplary embodiment in conjunction with the accompanying drawings.

DETAILED DESCRIPTION OF THE INVENTION

The following description of the invention is provided as an enabling teaching of the invention which includes the best, currently known embodiment. One skilled in the relevant art will recognize that many changes can be made to the embodiment described, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptions to the present inventions are possible and can even be desirable in certain circumstances, and are a part of the present invention. Thus, the following description is provided as illustrative of the principles of the present invention and not in limitation thereof. The scope of the present invention is defined by the claims. The terms "nanoparticle," "nanoparticle powder," and "nano powder" are generally understood by those of ordinary skill to encompass the same concept as described herein.

Figure 1:
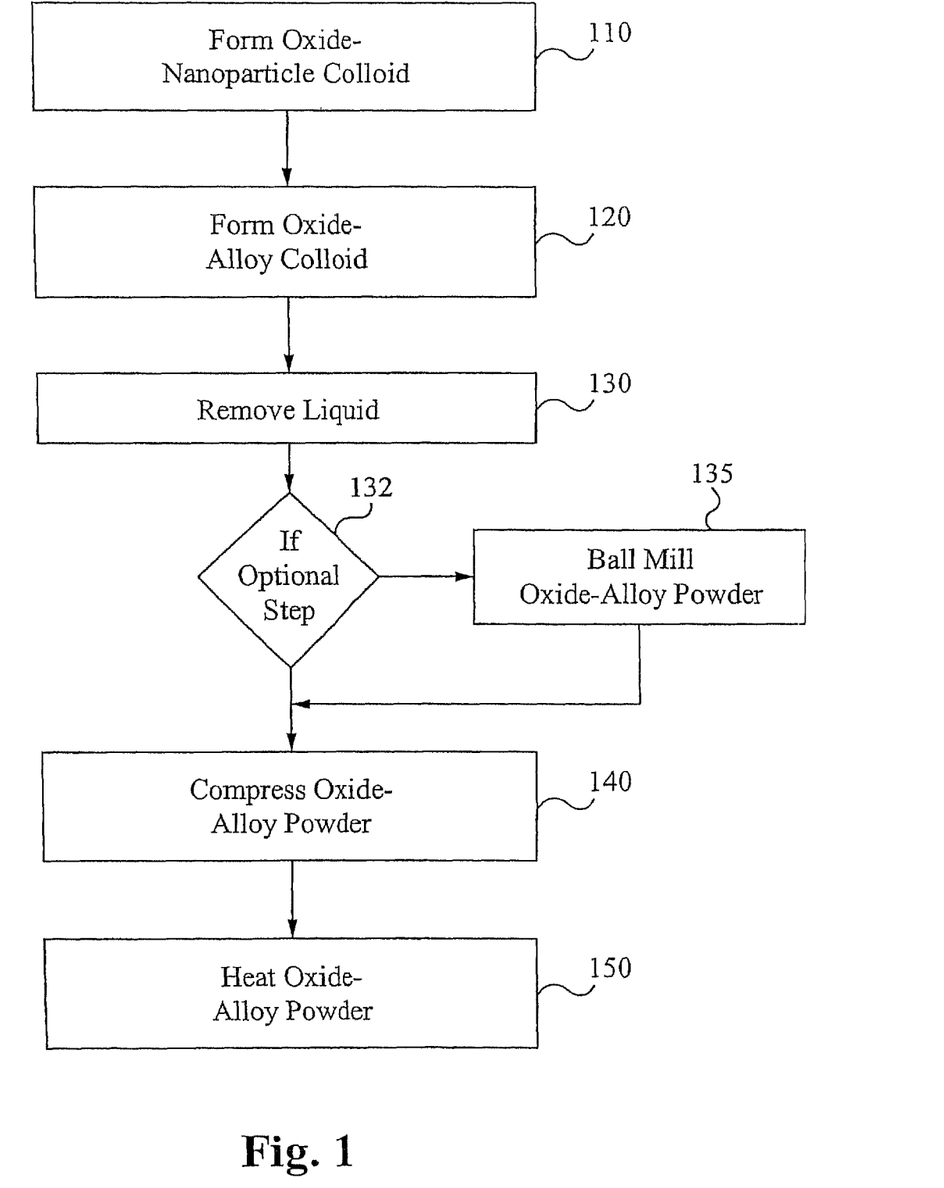
FIG. 1 illustrates a flow chart of a method of forming a oxide dispersion strengthened alloy in accordance with the principles of the present invention.

FIG. 1 illustrates a flow chart of steps for a method of forming an oxide dispersion strengthened alloy 100, according to the present invention. The method begins at a step 110. At the step 110, a colloid of oxide-nanoparticles is formed. The oxide-colloid is formed by adding nanoparticles, preferably 1-5 nanometers in their greatest dimension, to a liquid that has the properties that the nanoparticles can be suspended, prevents clumping of the nanoparticles, and that the liquid can readily be removed. Preferably, the liquid does not react with the oxide-nanoparticles. The quantity of liquid added to the nanoparticles is preferably sufficient to suspend the oxide-nanoparticles and the quantity of alloy-microparticles to be later added. It will be appreciated that the oxide-nanoparticles can be added to the liquid or the liquid can be added to the oxide-nanoparticles, or a combination of the two.

Alternatively, both the oxide-nano particles and the liquid can be concurrently added to a mixing vessel. The oxide-nanoparticles can be any suitable material that does not react with the alloy-microparticles or liquid. Material such as Alumina ($Al_2O_3$), Silica ($SiO_2$), or Yttria ($Y_2O_3$) that do not react with alloy metal can be used. Preferably, Yttria-nanoparticles are used. The quantity of oxide-nanoparticles used should be measured in proportion to the dry weight of the alloy-microparticles. Preferably, a quantity of oxide-nanoparticles should be selected so that the oxide-nanoparticles comprise 1-5% by weight of the resulting oxide-alloy powder.

In the step 120, the oxide-nanoparticle colloid is mixed with the alloy-microparticle powder. Within the scope contemplated by this invention is either the oxide-nanoparticles colloid being added to the alloy-microparticle powder or the alloy-microparticle powder being added to the oxide-nanoparticle colloid. The resulting mixture should be mixed until the oxide-nanoparticles are evenly distributed with the alloy-microparticles, resulting in an oxide-alloy colloid. It is expected that this is because of Van der Waal forces. The oxide-nanoparticles adhere to the alloy-microparticles. This adherence of the oxide-nanoparticles to the alloy-microparticles prevents clumping of oxide-nanoparticles and provides a substantially even distribution of oxide-nanoparticles throughout the colloid. Mixing can be accomplished by any standard means including stirring, shaking, tumbling, ultrasound, and pouring.

In the step 130, the oxide-alloy colloid is dried. In this step, substantially all of the liquid is removed such that only the alloy-microparticles with an even distribution of oxide-nanoparticles remain. This step 130 occurs after the mixing of the oxide-nanoparticles and the alloy microparticles. Evaporative drying is preferred, but other techniques are contemplated, such as heat drying, vacuum drying, freeze drying, centrifugal drying, chemical drying, or spray gun drying.

In the method of forming an oxide-alloy metal, there is an optional step for the ball milling of the dried oxide-alloy powder before compression and heating to form the oxide-dispersion strengthened alloy. In the step 132, a decision is made whether to ball mill the dried oxide-alloy powder. If the decision is taken to mill the oxide-alloy powder, then step 135 is performed. If the oxide-alloy powder is not to be milled, then the method continues on to step 140.

In the step 135, the optional processing by ball milling the dried oxide-alloy powder is disclosed. The pounding of the milling-balls is expected to embed the oxide-nanoparticles into the alloy as the microparticles are ground together and broken apart. This ball-milling is expected to further improve the uniformity of distribution of oxide-nanoparticles at the microstructure level within the alloy-microparticles.

In the step optional step 140, pressure is applied to the oxide-alloy powder. Preferably, the pressure is an axial pressure of thousands of pounds per square inch, applied by a mold, preferably a graphite mold. Pressures of 30-50 tons per square inch are typical. The pressure can be applied through a hydraulic press, preferably a punch press. However, other means of applying pressure are contemplated. The pressure can be applied before or during heating. Further, the pressure can be varied during the sintering step 150, preferably increasing the pressure as heat is applied. To handle these pressures, the mold for holding the oxide-alloy powder needs to be able to handle the applied pressures and, if sintering occurs within the same mold, the sintering temperature. The step 140 is optional. The oxide-alloy powder can be sintered without the application of pressure, but preferably pressure is applied to the oxide-alloy powder during sintering.

In the step 150, the oxide-alloy powder is heated to a sintering temperature. The heat can be applied externally or though a SPS (spark plasma sintering) process. The SPS technique pulses high current, preferably though the graphite press molds, and also through the oxide-alloy powder. One advantage of the SPS technique is the uniformity of applying heat. The powder, being electrically heated, heats substantially evenly from inside. The second advantage of the SPS process is the speed of the sintering process. A turbine disc can be formed in minutes as opposed to hours as is typical with a forging process.

Figure 2:
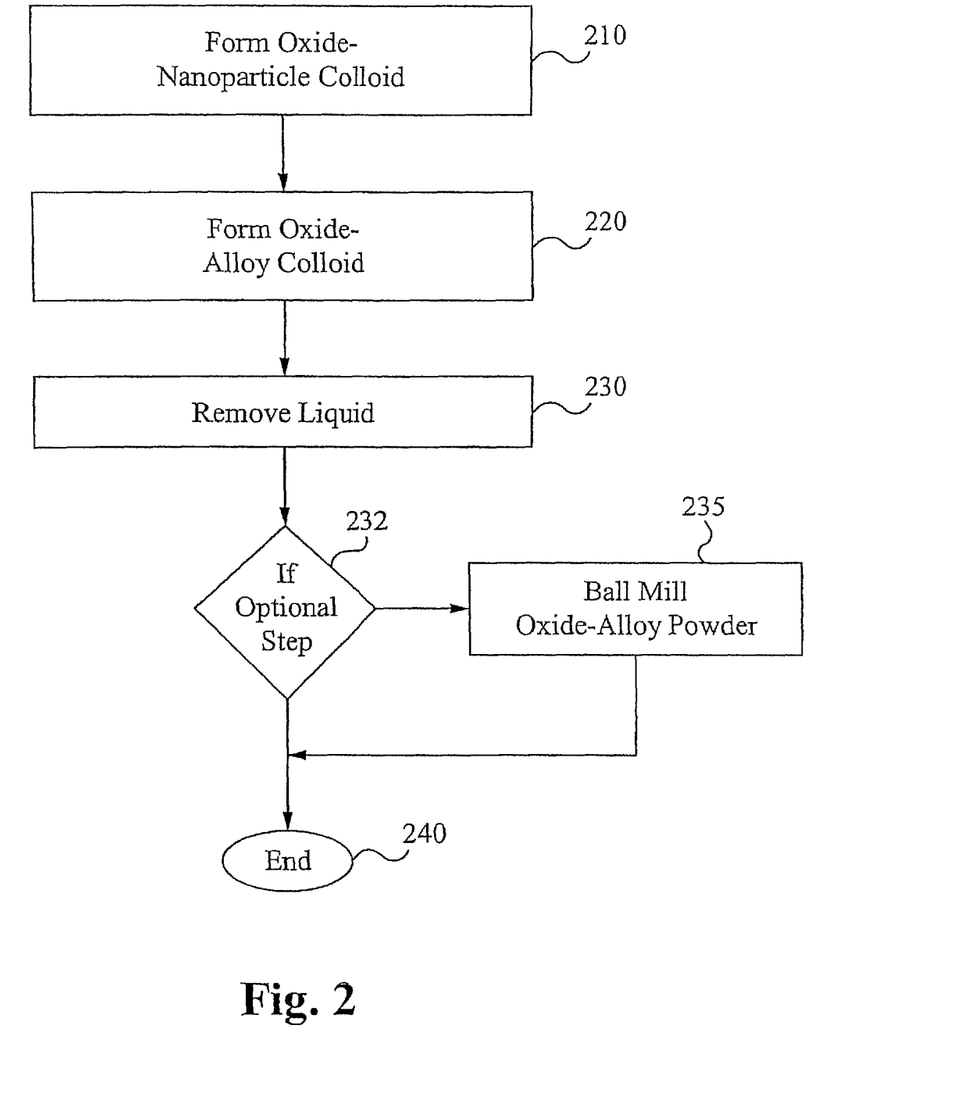
FIG. 2 illustrates a flow chart of a method of creating an alloy powder with evenly distributed oxide-nanoparticles in accordance with the principles of the present invention.

FIG. 2 illustrates the steps for the method of forming an alloy microparticle powder with evenly dispersed oxide-nanoparticles. The method begins in step 210 with the forming of an oxide-nanoparticle colloide, which is as described above in step 110 of FIG. 1. The step 220 of mixing the oxide-nanoparticle colloid with alloy-microparticles is as described above in step 120 of FIG. 1. The step 230 of drying the oxide-alloy colloid is as described above in step 130 of FIG. 1. The step 232 of making the decision to optionally ball-mill the oxide-alloy powder is as described above in step 132 of FIG. 1. The optional step 235 of ball-milling the dried oxide-alloy powder is as described above in step 135 for FIG. 1. The process ends at step 240 at either the completion of the ball-milling step 235 or upon a decision in step 232 not to ball-mill the oxide-alloy powder.

Figure 3A:
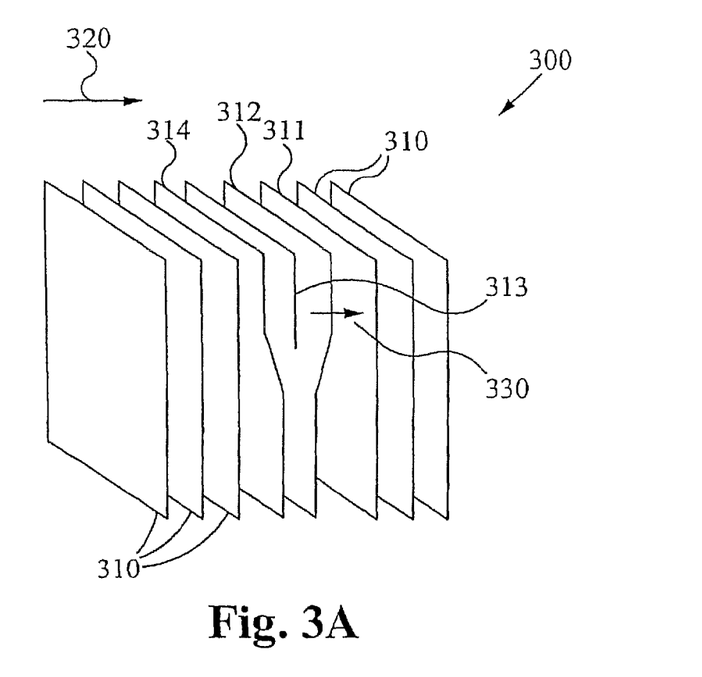
FIG. 3A illustrates the lattice structure of an alloy with a dislocation in accordance with the principles of the present invention.
Figure 3B:
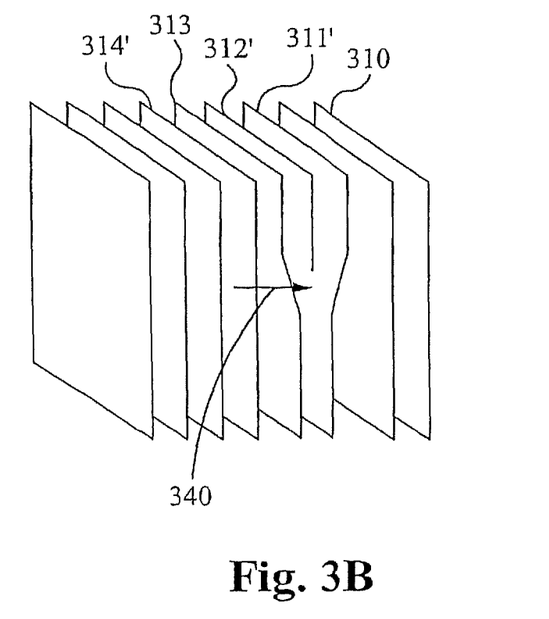
FIG. 3B illustrates the lattice structure of an alloy with a dislocation moved over one lattice plane in accordance with the principles of the present invention.

FIG. 3A illustrates one mechanism within a lattice structure by which a metal deforms or bends. A metal 300 is typically formed in a crystalline lattice structure with layers of interconnected atoms 310. Some of the lattice layers don't run the entire length of the lattice and terminate between other layers, creating a distortion of the other layers. These layers are referred to as dislocation layers. The dislocation layer 313 is shown terminated between two of the lattice layers, 312 and 313 respectively. The lattice layers 312 and 314 are shown adjacent to the dislocation layer 313 and distorted by the dislocation layer 313. When a shear or bending force 320 is applied to the lattice structure 300, the dislocation layer 313 can propagate as a wave through the metal. One manner by which the displacement wave front shifts through the lattice is for the distortion layer of the lattice to shift and connects to the adjacent layer. FIG. 3B shows the lattice structure after a displacement of one lattice plane. As shown in FIG. 3B, the dislocation layer 313 shifts to the right by one lattice plane width. The distorted plane 314 in FIG. 3A becomes the non-distorted plane 314' in FIG. 3B. The dislocation layer 313 in FIG. 3A shifts and joins the adjacent layer on the right, becoming a distorted layer 312' in FIG. 3B. Upper part of the distorted lattice layer 312 become the propagated dislocation layer 312' in FIG. 3B. The lattice layer 311 in FIG. 3A becomes a distorted layer as shown by 311' in FIG. 3B.

Figure 3C:
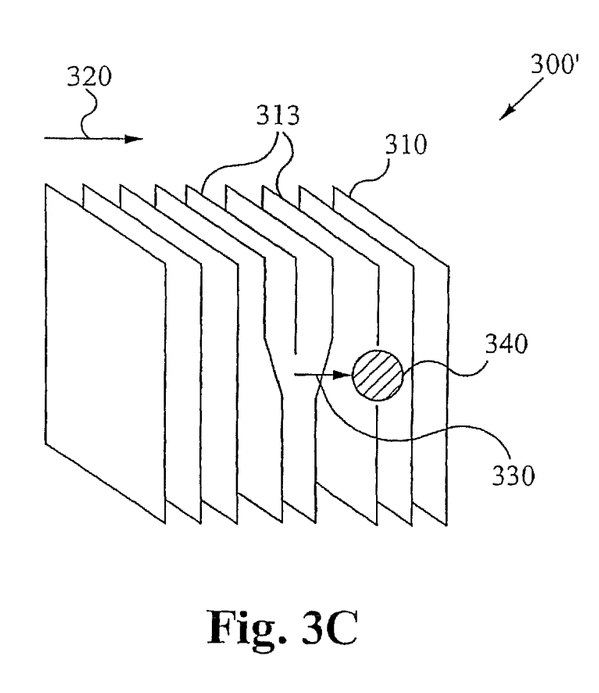
FIG. 3C illustrates the lattice structure of an alloy with a dislocation blocked by an oxide dispersion region in accordance with the principles of the present invention.

FIG. 3C illustrates the metal lattice structure of an oxide dispersion enhanced metal. When a shear force 330 is placed on metal 300", the propagation wave will travel until it encounters the oxide dispersion 340. This oxide dispersion impedes the propagation of the displacement wave. This resistance to displacement strengthens the metal to shear and bending forces.

An exemplary use of the present invention's method for producing an oxide-dispersion strengthened alloy is in the fabrication of a jet turbine disc. First a quantity of oxide-nanoparticle powder is selected for forming the turbine disc, preferably Yttria. The quantity is selected such that the formed disc contains 1-5% Yttria by weight. The Yttria nanoparticles are mixed with a liquid to form a colloid of Yttria nanoparticles. The nanoparticles and liquid are mixed and stirred to prevent the nanoparticles from clumping and forming larger particles. To this Yttria-nanoparticle colloid, an alloy-mircoparticle powder is added. Common alloys used in the fabrication of a turbine disc are nickel super-alloys, such as the Rolls Royce RR1000 or General Electric GE R80. RR1000 is comprised of 50-60% nickel, 14-15% chromium, 14-19% cobalt, 4-5% molybdenum, 3% aluminum, and about 4% titanium. The RR1000 alloy is added as an alloy-microparticle powder to the Yttria-nanoparticle colloid. This produces an Yttria-alloy colloid where Yttria-nanoparticles attach to the surface of the alloy-microparticles. Next, the Yttria-alloy colloid solution is then dried. This forms a powder with a uniform distribution of oxide-nanoparticles on the surface of the microparticles. Next, the Yttria-alloy powder is ball-milled. The optional ball-milling process further improves the uniformity of distribution of oxide-nanoparticles within the oxide-alloy powder. The powder is then placed into a graphite mold and subjected to a high pressure of up to 50 tons per square inch. DC electricity is pulsed through the graphite mold and through the oxide-alloy powder, heating it internally to a sintering temperature. The advantage of electrical heating is that the heating occurs substantially evenly throughout the powder and can be quickly heated. It is expected that the resulting disc is stronger at high operating temperatures than a forged disc formed from an alloy without uniform oxide dislocations. This example is exemplary of the two significant advantages to using the present inventive method to obtain an oxide-dislocation strengthened alloy. First, there is not a cost-effective alternative for creating an alloy with uniformly distributed oxide dispersions having the small geometry needed to stop dislocations from propagating through the alloy. The second advantage is that, in using this method, high strength metal structures can be formed in a cost-effective manner. For example, the forming of a turbine disc is currently accomplished with a forging process, which is both time consuming and expensive. By using an oxide dislocation strengthened powder along with a spark plasma sintering process, a turbine disk can be formed in minutes instead of hours, a small fraction of the time used for prior art methods.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made and equivalents may be substituted for elements in the embodiments chosen for illustration without departing from the spirit and scope of the invention as defined by the claims.

What is claimed is:

1. A method of forming an oxide-dispersion strengthened alloy comprising the steps:
   a. mixing a first quantity of oxide-nanoparticles with a liquid forming a colloid of oxide-nanoparticles, wherein the oxide-nanoparticles are 1-5 nanometers in the largest dimension;
   b. mixing the colloid of oxide-nanoparticles with a second quantity of alloy-microparticles forming an oxide-alloy colloid, wherein the oxide-nanoparticles are substantially uniformly distributed throughout the colloid, and wherein substantially all of the oxide-nanoparticles adhere to the alloy-microparticles and not to the oxide-nanoparticles;
   c. drying the oxide-alloy colloid, forming an oxide-alloy powder; and d. heating the oxide-alloy powder to a sintering temperature.

2. The method of claim 1, wherein the first quantity of oxide-nanoparticles is between 1% and 5% by weight of the oxide-alloy powder.

3. The method of claim 1, wherein the alloy-microparticles contain nickel.

4. The method of claim 1, wherein the alloy-microparticles contain greater than 50 wt % nickel.

5. The method of claim 2, wherein the first quantity of oxide-nanoparticles is selected from at least one of Alumina, Silica, and Yttria.

6. The method of claim 2, further comprising the step of applying pressure to the oxide-alloy powder.

7. The method of claim 6, wherein the pressure is applied axially with of a force of between 30 and 50 tons per square inch.

8. The method of claim 6, wherein the heating of the alloy powder is performed by a spark plasma process.

9. The method of claim 8, wherein the pressure is applied to the oxide-alloy powder with a graphite die.

10. The method of claim 1, further comprising the step of ball-milling the oxide-alloy powder.

11. A method of forming an oxide-alloy powder comprising the steps:
   a. mixing a first quantity of oxide-nanoparticles with a liquid forming a colloid of oxide-nanoparticles, wherein the oxide-nanoparticles are 1-5 nanometers in the largest dimension;
   b. mixing the colloid of oxide-nanoparticles with a second quantity of alloy-microparticles forming an oxide-alloy colloid, wherein the oxide-nanoparticles are substantially uniformly distributed throughout the colloid, and wherein substantially all of the oxide-nanoparticles adhere to the alloy-microparticles and not to oxide-nanoparticles; and
   c. drying the oxide-alloy colloid, forming an oxide-alloy powder.

12. The method of claim 11, wherein the first quantity of oxide-nanoparticles is between 1% and 5% by weight of the oxide-alloy powder.

13. The method of claim 12, further comprising the step of ball-milling the oxide-alloy powder.

14. The method of claim 12, wherein the first quantity of oxide-nanoparticles is selected from at least one of Alumina, Silica, and Yttria.

* * * * *